US005197103A

United States Patent [19]

Hayakawa

[11] Patent Number: 5,197,103

[45] Date of Patent: Mar. 23, 1993

[54] LOW SOUND LOUDSPEAKER SYSTEM

[75] Inventor: Junichi Hayakawa, Kawasaki, Japan

[73] Assignee: Kabushiki Kaisha Kenwood, Tokyo, Japan

[21] Appl. No.: 845,841

[22] Filed: Mar. 6, 1992

Related U.S. Application Data

[63] Continuation of Ser. No. 593,658, Oct. 5, 1990, abandoned.

[51] Int. Cl.[5] .................... H04R 1/02; H04R 25/00; H05K 5/00

[52] U.S. Cl. .................... 381/159; 381/88; 381/89; 381/90; 381/154; 181/156; 181/148

[58] Field of Search .................... 181/156, 148; 381/154, 381/88, 89, 90, 158, 159

[56] References Cited

U.S. PATENT DOCUMENTS

| | | | |
|---|---|---|---|
| 2,224,919 | 7/1940 | Olson . | |
| 3,047,090 | 7/1962 | Pruden | 181/156 |
| 4,168,761 | 9/1979 | Pappanikolaou | 181/156 |
| 4,628,528 | 12/1986 | Bose et al. | 381/154 |
| 4,875,546 | 10/1989 | Krnan | 181/156 |

FOREIGN PATENT DOCUMENTS

| | | | |
|---|---|---|---|
| 3214226A1 | 10/1983 | Fed. Rep. of Germany . | |
| 0120586 | 5/1988 | Japan | 381/159 |
| 0314000 | 12/1988 | Japan | 381/154 |
| 0288099 | 11/1989 | Japan | 381/159 |

OTHER PUBLICATIONS

Patent Abstracts of Japan, vol. 8, No. 39 (E-228) (1476), Feb. 21, 1984; and JP-A-58019697 (Matsushita K.K.) Nov. 16, 1983.

Radio Shack Cat. No. 62-2309 Entitled "Building Speaker Enclosures" By David B. Weems published in 1984.

*Primary Examiner*—James L. Dwyer
*Assistant Examiner*—Jason Chan
*Attorney, Agent, or Firm*—Sixbey, Friedman, Leedom & Ferguson

[57] ABSTRACT

A low sound loudspeaker system is constructed of an acoustic pipe extending from the back side of a loudspeaker unit, an air chamber provided at the front side of the loudspeaker unit, and a bass reflex port provided within the air chamber. The acoustic pipe communicates with the air chamber via the aperture of the acoustic pipe.

11 Claims, 6 Drawing Sheets

LOW SOUND LOUDSPEAKER SYSTEM

This application is a continuation of Ser. No. 07/593,658, filed Oct. 5, 1990, now abandoned.

FIELD OF THE INVENTION

The present invention is related to low sound loudspeaker systems.

BACKGROUND OF THE INVENTION

There are known conventional low sound loudspeaker systems such as disclosed in U.S. Pat. No. 4,064,966, U.S. Pat. No. 4,628,528, and Japanese Laid-Open No. 63-120586.

FIGS. 1A and 1B show examples of the structure of above-described prior art loudspeaker systems.

Above-described prior art loudspeaker systems have a disadvantage that unnecessary high sounds in an acoustic pipe leak out of an aperture.

Furthermore, in above-described prior art low sound loudspeaker systems, the loudspeaker unit is disposed facing in the direction indicated by arrow F same as that of the sound radiation direction of the system. Accordingly, as exemplary shown in FIG. 1B, the thickness t of the cabinet is dependent upon the diameter d of the loudspeaker unit so that there is associated with a difficulty in providing a compact low sound loudspeaker system to be mounted on a vehicle.

The present invention has been made in consideration of the above problems.

It is therefore an object of the present invention to provide low sound loudspeaker systems capable of further attenuating unnecessary high sound components.

It is a further object of this invention to provide low sound loudspeaker systems capable of making small the thickness of a cabinet and mounting the loudspeaker system on a vehicle.

SUMMARY OF THE INVENTION

According to a first aspect of this invention, the low sound loudspeaker system is constructed of an acoustic pipe extending from the back side of a loudspeaker unit, an air chamber provided at the front side of the loudspeaker unit, and a bass reflex port provided within the air chamber, the acoustic pipe communicating with the air chamber via the aperture of the acoustic pipe.

In this system, the resonance frequency of the bass reflex port is set at substantially the same frequency where the half wavelength stands in the acoustic pipe.

According to this invention, the acoustic pipe is adapted to communicate with the air chamber via an aperture of the acoustic pipe. Therefore, high sound components generated by the loudspeaker unit are attenuated by the filtering effect of the air chamber.

Furthermore, the resonance frequency of the bass reflect port is set substantially at the same frequency where the half wavelength stands in the acoustic pipe. Therefore, sounds radiated at the front side of the loudspeaker unit become in phase with sounds radiated from the backside of the loudspeaker unit, at the area composed of the air chamber and the port.

Since the air chamber and the port constitute a bass reflect type loudspeaker, low sound components are radiated efficiently to the outside.

According to a second aspect of this invention, in the low sound loudspeaker system constructed as above, a partition plate for defining the air chamber and acoustic pipe is provided, and the partition plate forms an inner and upper surface of the acoustic pipe at the area from one end to the other end of the acoustic pipe.

In the low sound loudspeaker system constructed as above, the acoustic pipe is mounted at the outside of the loudspeaker enclosure, and is made flexible.

Furthermore, the direction of radiating sounds from the loudspeaker unit differs approximately 90 degrees from the direction of the bass reflex port.

The resonance frequency of the bass reflex port is set at substantially the same frequency where the half wavelength stands in the acoustic pipe.

According to the structure of the second aspect of this invention, a partition plate for defining the air chamber and acoustic pipe is provided, and the partition plate forms an inner and upper surface of the acoustic pipe at the area from one end to the other end of the acoustic pipe. It is therefore possible to make compact the cabinet.

The acoustic pipe is mounted at the outside of the loudspeaker enclosure, and is made flexible. It is therefore possible to make compact the cabinet. Since the acoustic pipe is flexible, the degree of freedom of installation can be improved.

Furthermore, the resonance frequency of the bass reflect port is set substantially at the same frequency where the half wavelength stands in the acoustic pipe. Therefore, sounds radiated at the front side of the loudspeaker unit become in phase with sounds radiated from the backside of the loudspeaker unit, at the area composed of the air chamber and the port.

Since the air chamber and the port constitute a bass reflect type loudspeaker, low sound components are radiated efficiently to the outside.

DETAILED DESCRIPTION OF THE INVENTION

Figure 1A:
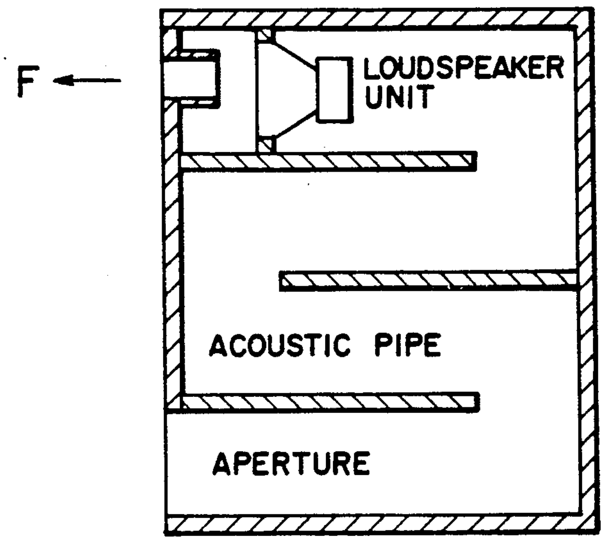
FIG. 1A (PRIOR ART)
FIGS. 1*a*–1*b* shows the structure of a conventional low sound loudspeaker system.
Figure 1B:
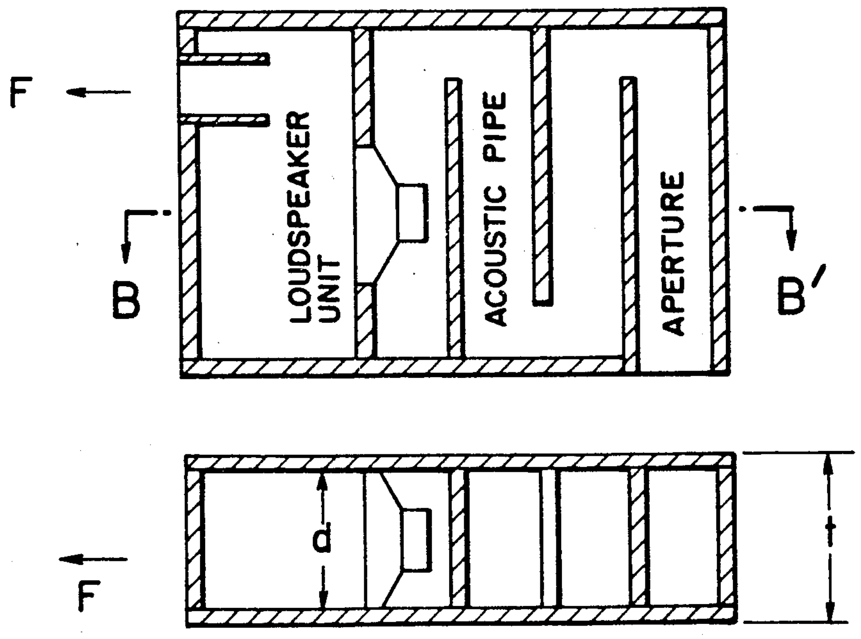
FIG. 1B (PRIOR ART)
Figure 2:
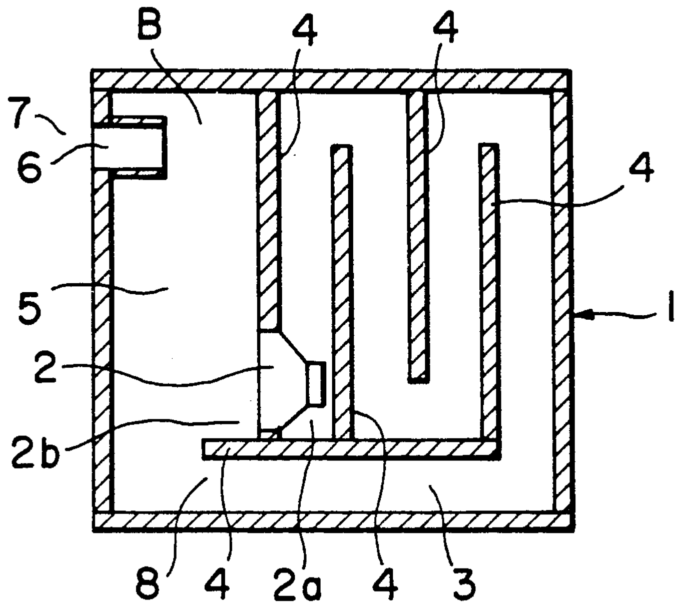
FIG. 2 shows the structure of a first embodiment of this invention.

A first embodiment of a low sound loudspeaker system of this invention is shown in FIG. 2.

In FIG. 2, reference numeral 1 represents a loudspeaker enclosure, 2 a loudspeaker unit, 3 an acoustic pipe extending from the back 2*a* of the loudspeaker unit 2, 4 partition plates defining the acoustic pipe, 5 an air chamber formed at the front side 2*b* of the loudspeaker unit 2, 6 a port making the air chamber 5 in communication with the outside 7 of the loudspeaker enclosure 1, and 8 an aperture of the acoustic pipe 3 at which the acoustic pipe 3 communicates with the air chamber 5.

The resonance frequency of the port 6 is set at substantially the same frequency where the half wavelength stands in the acoustic pipe 3.

The frequency of the resonant bass reflex system comprising air chamber 5 and port 6 at which the half wavelength would stand in the pipe 3 is the frequency having a wavelength equal to twice the length of the pipe 3. Thus, the specific resonant frequency of the bass reflex system will be set to be twice the resonant frequency of pipe 3. Wavelength and frequency are inversely related. Therefore, the wavelength of the resonant frequency of the bass reflex system will be half the wavelength of the resonant frequency of pipe 3. Also, it is well-known in the art that an acoustic pipe has a resonant frequency with a wavelength of four times the length of the pipe. As a result, the length of the acoustic pipe 3 will be equal to half the wavelength of the specific resonant frequency of the bass reflex system.

In the low sound loudspeaker system constructed as above, a bass reflex type loudspeaker system B constructed of the Air chamber 5 and the port 6 is provided at the front side 2*b* of the loudspeaker unit 2. Therefore, sounds radiated from the front side 2*b* of the loudspeaker unit 2 and introduced into the air chamber 5 are outputted to the outside 7 of the loudspeaker enclosure 1, having low sound components of approximately the opposite phase and near to the resonance frequency of the port 6.

In the meantime, sounds radiated from the back side 2*a* of the loudspeaker unit 2 and guided via the acoustic pipe 3 to the aperture 8 have low sound components, at the aperture 8, of approximately the opposite phase to the phase at the back side 2*a* and of approximately the frequency where the half wavelength stands in the acoustic pipe 3 of the low sound loudspeaker system.

Sounds passed through the acoustic pipe 3 are also introduced in the bass reflex type loudspeaker system B. In this bass reflex type loudspeaker system B, sounds from the front side 2*b* of the loudspeaker unit 2 and those from the back side 2*a* are added together, reproducing low sound components more efficiently.

Reproduction efficiency is improved considerably because of the structure that the resonance frequency of the port 6 is set at substantially the same frequency where the half wavelength stands in the acoustic pipe 3.

Sounds radiated into the acoustic pipe 3 are most emphasized at the frequency where the wavelength has two times as long as the length of the acoustic pipe 3, and radiated into the outside (air chamber 5) of the aperture 8. Sounds having a different frequency whose wavelength is a multiple in odd number of the length of the acoustic pipe 3 are also radiated in the outside of the aperture 3. In this case, however, such sounds have at the aperture 8 the opposite phase to that at the front side 2*b* so that they are canceled by the sounds at the front side 2*b* of the loudspeaker unit 2, whereas other sounds are introduced into the air chamber 5. Consequently, high sound components are efficiently attenuated by the filtering effect of the air chamber 5.

Furthermore, since the air chamber 5 and the acoustic pipe 3 are communicated with each other via the aperture 8, the equivalent length of the acoustic pipe 3 becomes longer and the equivalent volume of the air chamber 5 becomes large, thereby broadening the low sound bandwidth.

Figure 3:
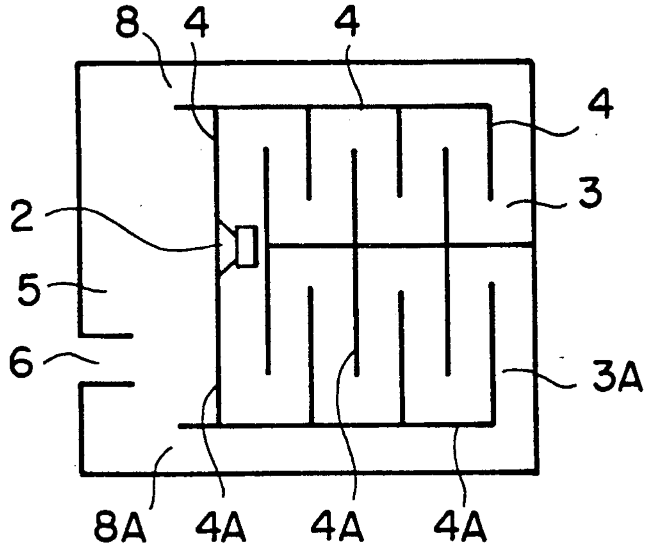
FIG. 3 shows the structure of a second embodiment of this invention.
Figure 4:
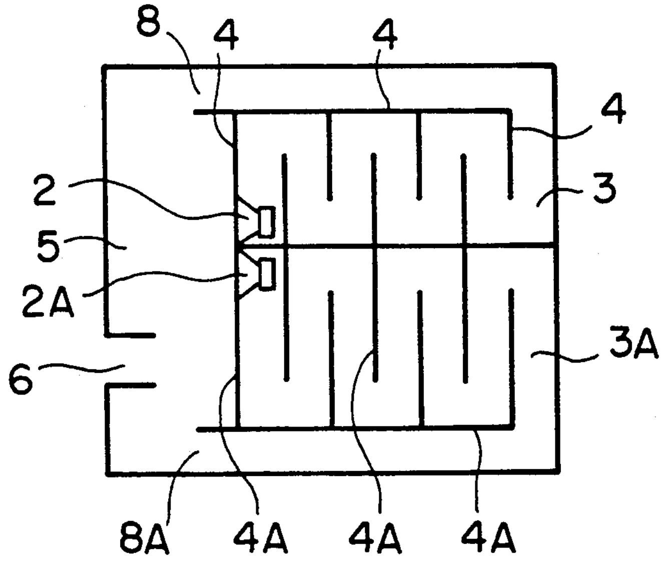
FIG. 4 shows the structure of a third embodiment of this invention.

FIGS. 3 and 4 show the second and third embodiments of this invention. In the embodiment shown in FIG. 3, partition plates 4A are disposed to form two acoustic pipes 3 and 3A having their apertures 8 and 8A via which the acoustic pipes 3 and 3A and the air chamber 5 are communicated with each other.

In the embodiment shown in FIG. 4, there are provided two loudspeaker units 2 and 2A each having dedicated acoustic pipes 3 and 3A, respectively. The acoustic pipes 3 and 3A communicate with the air chamber 5 via corresponding apertures 8 and 8A.

In the embodiments shown in FIGS. 3 and 4, the length of the acoustic pipes 3 and 3A may be the same or different. The air chamber may be divided into two air chambers.

According to the above embodiments, in a low sound loudspeaker constructed of an acoustic pipe extending from the back side of the loudspeaker unit, an air chamber formed at the front side of the loudspeaker unit, and a bass reflect port provided in the air chamber, the acoustic pipe is adapted to communicate with the air chamber via an aperture of the acoustic pipe. Therefore, high sound components generated by the loudspeaker unit are attenuated by the filtering effect of the air chamber.

Furthermore, the resonance frequency of the bass reflect port is set substantially at the same frequency where the half wavelength stands in the acoustic pipe. Therefore, sounds radiated at the front side of the loudspeaker unit become in phase with sounds radiated from the backside of the loudspeaker unit, at the area composed of the air chamber and the port.

Since the air chamber and the port constitute a bass reflect type loudspeaker, low sound components are radiated efficiently to the outside.

In summary, the advantages of the embodiments of this invention shown in FIGS. 2 to 4 are as follows:

(1) unnecessary high sound components can be considerable attenuated;

(2) reproduction efficiency of low sounds can be improved; and (3) since an opening of the loudspeaker system is only one, the freedom of location thereof can be improved.

Furthermore, the system of this invention is simple in structure and cost effective, allowing easy installation.

Figure 5A:
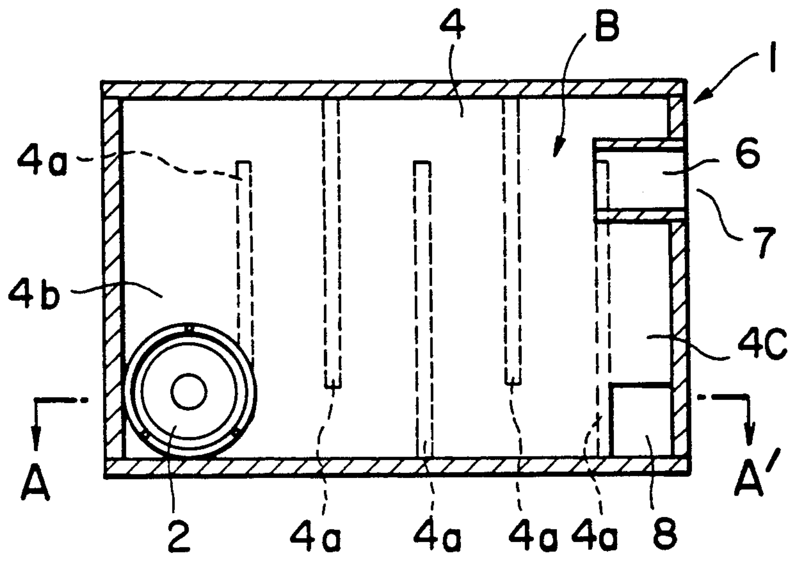
FIGS. 5*a*–5*b* shows the structure of a fourth embodiment of this invention.
Figure 5B:
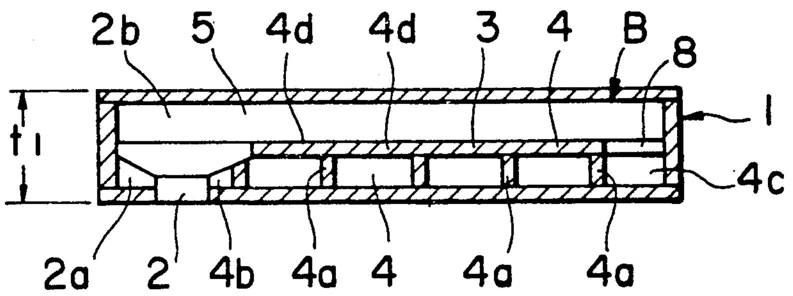

FIGS. 5A and 5B, show the fourth embodiment, wherein FIG. 5A is a sectional view and FIG. 5B is a sectional view taken along line A—A' of FIG. 5A.

In FIGS. 5A and 5B, reference numeral 1 represents a loudspeaker enclosure, 3 a partition plate mounted within the loudspeaker enclosure 1, 2*a* the back side of the loudspeaker unit 2, 2*b* the front side of the loudspeaker unit 2, 4 an acoustic pipe extending from the back side 2*a* of the loudspeaker unit 2, 4*a* pipe defining plates mounted between the partition plate 3 and the loudspeaker enclosure 1 for defining the acoustic pipe 4, 4*b* one end of the acoustic pipe 4, and 4*c* the other end of the acoustic pipe, one inner and upper surface of the acoustic pipe 4 being defined by the partition plate 3 in the area from the one end 4*b* to the other end 4*c* thereof.

Reference numeral 5 represents an air chamber formed at the front side 2*b* of the loudspeaker unit 2 and defined by the loudspeaker enclosure 1 and the partition plate 3, 6 a port for making the air chamber 5 in communication with the outside 7 of the loudspeaker enclosure 1, and 8 an aperture formed at the other end 4*c* of the acoustic pipe 4. This aperture 8 is formed in the partition plate 3 and serves to make the acoustic pipe 4 in communication with the air chamber 5.

The resonance frequency of the port 6 is set at substantially the same frequency where the half wavelength stands in the acoustic pipe 4.

In the low sound loudspeaker system constructed as above, a bass reflex type loudspeaker system B constructed of the air chamber 5 and the port 6 is provided at the front side 2*b* of the loudspeaker unit 2. Therefore, sounds radiated from the front side 2*b* of the loudspeaker unit 2 and introduced into the air chamber 5 are outputted to the outside 7 of the loudspeaker enclosure 1, having low sound components of approximately the opposite phase and near at the resonance frequency of the port 6.

In the meantime, sounds radiated from the back side 2*a* of the loudspeaker unit 2 and guided via the acoustic pipe 4 to the aperture 8 formed at the other end 4*c* have low sound components, at the aperture 8, of approximately the opposite phase to the phase at the back side 2*a* and of approximately the same frequency where the half wavelength stands in the acoustic pipe 4 of the low sound loudspeaker system.

Sounds passed through the acoustic pipe 3 are also introduced in the bass reflex type loudspeaker system B. In this bass reflex type loudspeaker system B, sounds from the front side 2*b* of the loudspeaker unit 2 and those from the back side 2*a* are added together, reproducing low sound components more efficiently.

Reproduction efficiency is improved considerably because of the structure that the resonance frequency of the port 6 is set at substantially the same frequency where the half wavelength stands in the acoustic pipe 4.

With the structural arrangement of the loudspeaker unit 2, acoustic pipe 4, and air chamber 5 as described above, the dimension t1 of the loudspeaker enclosure 1 can be made small.

Figure 6:
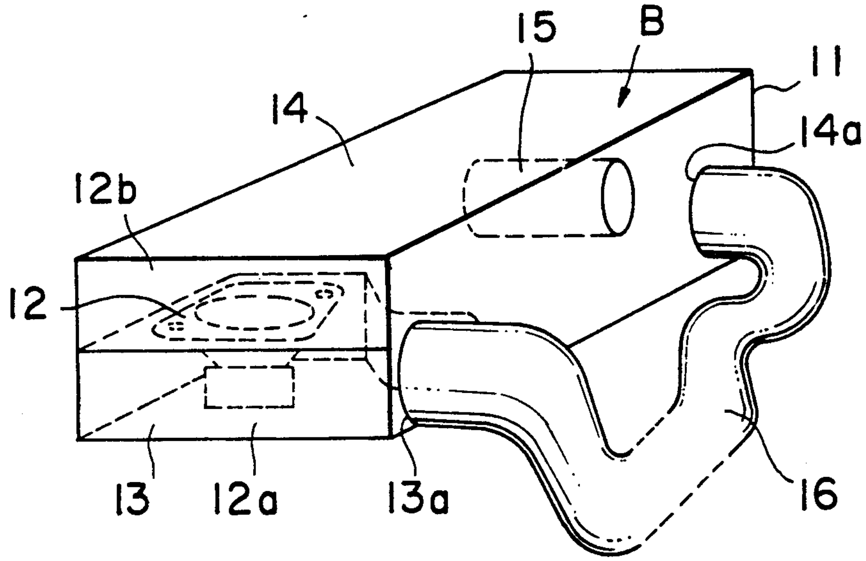
FIGS. 6 to 8 show the structure of a fifth embodiment of this invention
Figure 7:
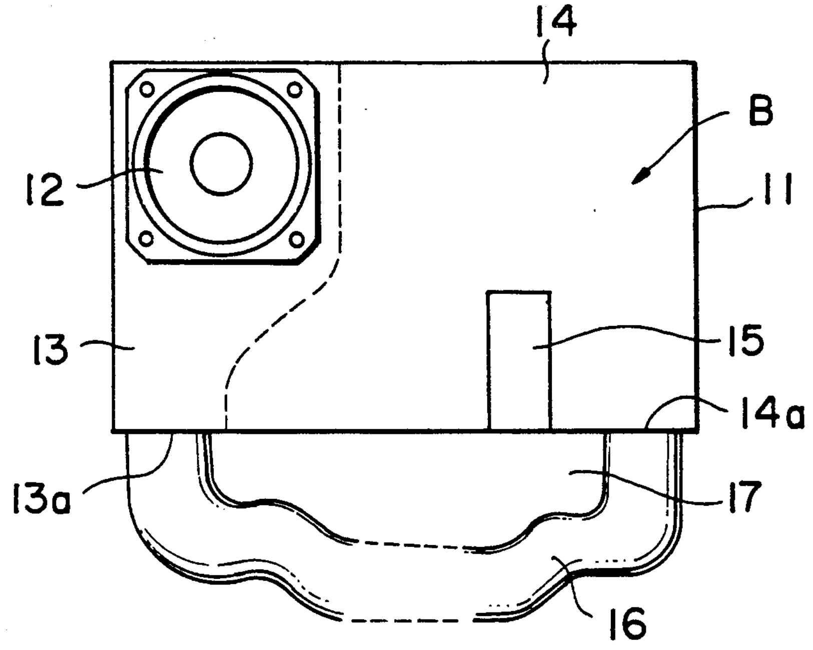
Figure 8:
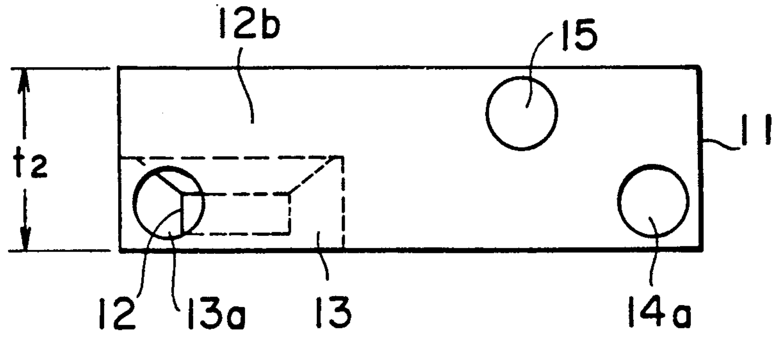

FIGS. 6 to 8 show the fifth embodiment, wherein FIG. 6 is a perspective view, FIG. 7 is a sectional view, and FIG. 8 is a front view.

In FIGS. 6 to 8, reference numeral 11 represents a loudspeaker enclosure, and 12 a loudspeaker unit. The loudspeaker unit 12 is mounted between a small air chamber 13 and an air chamber 14 such that sounds radiated to the back side 12*a* of the loudspeaker unit 12 are introduced into the small air chamber 13 and sounds radiated to the front side 13*b* of the loudspeaker unit 12 are introduced into the air chamber 14.

A port 15 is mounted within the air chamber 14. Between an aperture 13*a* formed in the wall of the small air chamber 13 and an aperture 14*a* formed in the wall of the air chamber 14, there is connected a flexible acoustic pipe 16.

The resonance frequency of the port 15 is set at substantially the same frequency where the half wavelength stands in the acoustic pipe 16.

In the low sound loudspeaker system constructed as above, a bass reflex type loudspeaker system B constructed of the air chamber 14 and the port 15 is provided at the front side 12*b* of the loudspeaker unit 12. Therefore, sounds radiated from the front side 12*b* of the loudspeaker unit 12 and introduced into the air chamber 14 are outputted to the outside 17 of the loudspeaker enclosure 11, having low sound components of approximately the opposite phase and near at the resonance frequency of the port 15.

In the meantime, sounds radiated from the back side 12*a* of the loudspeaker unit 12 and guided via the acoustic pipe 16 to the air chamber 14 have low sound components, near at the aperture 14*a*, of approximately the opposite phase to the phase at the back side 12*a* and of approximately the same frequency where the half wavelength stands in the acoustic pipe 16 of the low sound loud speaker system.

Sounds passed through the acoustic pipe 16 are also introduced in the bass reflex type loudspeaker system B. In this bass reflex type loudspeaker system B, sounds from the front side 12*b* of the loudspeaker unit 12 and those from the back side 12*a* are added together, reproducing low sound components more efficiently.

Reproduction efficiency is improved considerably because of the structure that the resonance frequency of the port 15 is set at substantially the same frequency where the half wavelength stands in the acoustic pipe 16.

In the fifth embodiment, with the structural arrangement of the loudspeaker unit 12, acoustic pipe 16, and air chamber 14 as described above, the dimension t2 of the loudspeaker enclosure 1 can be made small.

A plurality of apertures 13*a* and 14*b* may be formed to thereby further improve the freedom of installation. In this case, it is needless to say that non-use apertures should be closed.

If the length of the acoustic pipe 16 is made variable, the sound quality can be adjusted, allowing various customized applications.

According to the low sound speaker system shown in FIGS. 5 to 8, the above structural arrangement makes the enclosure compact. Therefore, the system can be easily installed below a vehicle seat.

Since the acoustic pipe is mounted outside of the enclosure, it may be made smaller. Furthermore, since the acoustic pipe is flexible, the degree of freedom can be further improved in installing the system within a small space of a vehicle.

Provision of a bass reflect type loudspeaker system composed of the air chamber and port enables efficient radiation of low sound components to the outside of the enclosure.

Furthermore, the system of this invention is simple in structure and cost effective, allowing easy installation.

What is claimed is:

1. A low frequency loudspeaker system comprising:
   - a tuned acoustic pipe extending along its length in a sound propagation direction from the back side of a loudspeaker unit;
   - an air chamber provided at the front side of said loudspeaker unit; and
   - a bass reflex port provided within said air chamber to constitute a bass reflex system with a specific bass reflex resonance frequency;
   - said acoustic pipe extending to said air chamber via an aperture of said acoustic pipe, and having a cross-section that is substantially constant over its length and said length being equal to half the wavelength of the specific bass reflex resonance frequency.

2. A low frequency loudspeaker system according to claim 1, wherein the resonance frequency of said bass reflex port is set at substantially the same frequency where the half wavelength stands in said acoustic pipe.

3. A low frequency loudspeaker system according to claim 1, wherein a partition plate is provided having first and second sides for defining said air chamber and said acoustic pipe with the first side facing the air chamber and the second side facing the acoustic pipe such that said second side forms an inner surface of said acoustic pipe through the length of said acoustic pipe.

4. A low frequency loudspeaker system according to claim 3, wherein the resonance frequency of said base reflex port is set at substantially the same frequency where the half wavelength stands in said acoustic pipe.

5. A low frequency loudspeaker system according to claim 1, wherein the system further includes an enclosure enclosing said air chamber and said loudspeaker unit and said acoustic pipe extends from rearwardly of said loudspeaker unit to said air chamber outside of the enclosure, and is made flexible.

6. A low frequency loudspeaker system according to claim 5, wherein the resonance frequency of said bass reflex port is set at substantially the same frequency where the half wavelength stands in said acoustic pipe.

7. A low frequency loudspeaker system comprising:

a loudspeaker unit;

a bass reflex structure comprising an air chamber and port, which is provided at a front side of said loudspeaker unit and has a specific bass reflex resonance frequency; and an acoustic pipe provided at the back side of said loudspeaker unit and extending along its length in a sound propagation direction to an outlet in the air chamber of said bass reflex structure, a cross-section of the pipe being substantially constant over its length and said length being equal to half the wavelength of the specific bass reflex resonance frequency.

8. A low frequency loudspeaker system according to claim 7, wherein the length of said pipe extends laterally to the loudspeaker unit.

9. A low frequency loudspeaker system according to claim 8, wherein said acoustical pipe is a flexible tube.

10. A low frequency loudspeaker system according to claim 7 wherein the bass reflex structure and the loudspeaker unit are constructed as a unit forming a speaker enclosure, and said acoustical pipe is a flexible tube mounted extending from rearwardly of the loudspeaker unit to said air chamber outside said enclosure.

11. A low frequency loudspeaker system according to claim 10 wherein the bass reflex port is located at a front side of the loudspeaker system corresponding in orientation to the front side of said loudspeaker unit and said flexible tube extends generally outward to a side of said loudspeaker system other than the front side thereof.

* * * * *